US008608468B2

(12) United States Patent
Lee

(10) Patent No.: US 8,608,468 B2
(45) Date of Patent: Dec. 17, 2013

(54) WIDE AREA STAMP FOR ANTIREFLECTIVE SURFACE

(75) Inventor: Kwangyeol Lee, Namyangju-si (KR)

(73) Assignee: Korea University Research and Business Foundation, Seoul (KR)

( * ) Notice: Subject to any disclaimer, the term of this patent is extended or adjusted under 35 U.S.C. 154(b) by 13 days.

(21) Appl. No.: 13/407,488

(22) Filed: Feb. 28, 2012

(65) Prior Publication Data

US 2012/0156321 A1    Jun. 21, 2012

Related U.S. Application Data

(62) Division of application No. 12/500,946, filed on Jul. 10, 2009, now Pat. No. 8,147,704.

(51) Int. Cl.
*B29C 59/02* (2006.01)

(52) U.S. Cl.
USPC .......................................... 425/385; 977/952

(58) Field of Classification Search
USPC ................................. 425/385; 977/902, 952
See application file for complete search history.

(56) References Cited

U.S. PATENT DOCUMENTS

| 7,189,635 | B2 | 3/2007 | Sharma |
| 8,147,704 | B2 | 4/2012 | Lee |
| 2002/0133129 | A1* | 9/2002 | Arias et al. ............... 604/272 |
| 2007/0049028 | A1 | 3/2007 | Subramanian et al. |
| 2008/0061214 | A1* | 3/2008 | Lee et al. ................. 249/112 |
| 2008/0067721 | A1 | 3/2008 | Yu et al. |
| 2008/0217819 | A1 | 9/2008 | Lee et al. |
| 2010/0203235 | A1 | 8/2010 | Verschuuren et al. |

OTHER PUBLICATIONS

International Search Report and Written Opinion from International Application No. PCT/KR2010/004358 mailed Sep. 21, 2010.
U.S. Appl. No. 12/500,946, Jun. 8, 2011, Office Action.
U.S. Appl. No. 12/500,946, Sep. 22, 2011, Office Action.
U.S. Appl. No. 12/500,946, Nov. 29, 2011, Notice of Allowance.
U.S. Appl. No. 12/500,946, Mar. 14, 2012, Issue Notification.

* cited by examiner

*Primary Examiner* — Yogendra Gupta
*Assistant Examiner* — Robert J Grun
(74) *Attorney, Agent, or Firm* — Workman Nydegger

(57) ABSTRACT

Nanoimprint molds for molding a surface of a material are provided. A nanoimprint mold includes a body with a molding surface that is formed by shaped nanopillars. The nanopillars may be formed on a substrate and shaped by performing at least a first partial oxidation of the nanopillars and then removing at least a portion of the oxidized material. Once shaped, a hard substance is deposited on the nanopillars to begin forming the molding surface of the nanoimprint mold. The deposition of a hard substance is followed by the deposition of carbon nanotube on the hard substance and then the removal of the substrate and nanopillars from the molding surface.

23 Claims, 6 Drawing Sheets

WIDE AREA STAMP FOR ANTIREFLECTIVE SURFACE

CROSS-REFERENCE TO RELATED APPLICATIONS

This application is a division of U.S. application Ser. No. 12/500,946, filed Jul. 10, 2009, which is hereby incorporated by reference in its entirety.

TECHNICAL FIELD

Embodiments described herein relate to molds. More particularly, embodiments relate to nanoimprint molds to endow a surface with characteristics or properties.

BACKGROUND

Natural materials including biological surfaces often have desirable characteristics or properties. The surface of a cicada wing, for example, is antireflective. The surface of a lotus leaf is water-repellent and self cleaning. While biological surfaces often have desirable characteristics or properties, the ability to replicate biological materials including biological surfaces is difficult when using a biospecimen as a pattern.

Biospecimens have been used as templates for nanoimprint molds that can hopefully be used for reconstructing the biological surface in another material. For instance, a nanoimprint that is created from a biospecimen template could be used to construct a surface that has the properties of the biospecimen template.

Unfortunately, biospecimens have substantial limitations that make it difficult to create a successful nanoimprint mold—particularly for wide area nanopattern formations. One weak point of bio-replicating is that the nanopattern of biospecimens typically has a relatively small surface area. In addition, biospecimens often have imperfect repeating patterns within the small surface area. As a result, bio-specimens have been unsuccessful in wide area nanopattern formation.

DETAILED DESCRIPTION

Figure 1:
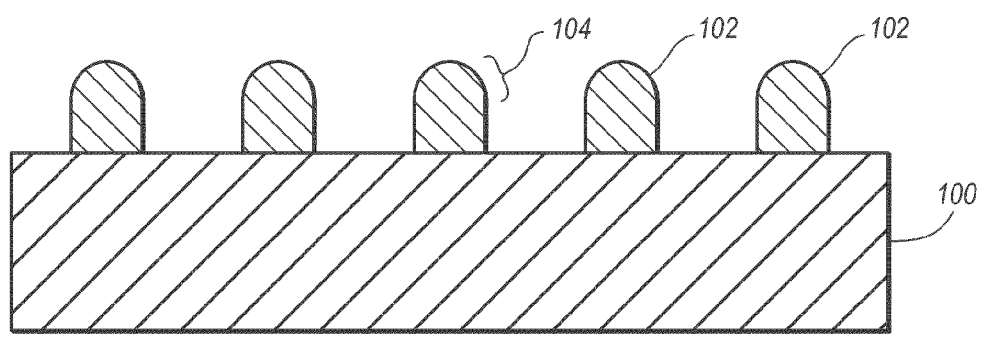
FIG. 1 shows a side view of an illustrative embodiment of a substrate with nanopillars formed thereon.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

Biological materials including biological surfaces often have certain desirable properties. Biological surfaces, for example, can be self-cleaning, antireflective, and the like. Some embodiments described herein relate to molds, including nanoimprint molds, that can be used for wide area nanopattern formation. The nanoimprint molds can be used to construct, form, or mold surfaces that have certain properties, for example, antireflective, hydrophobic, and the like. The ability to form surfaces that are, by way of example only, self-cleaning or antireflective, have applicability in many applications, including optics, display, paints, cleaning, and the like.

Some embodiments provide a nanopattern with repeating units of individual nanostructures or aggregates of nanostructures in a nanoimprint mold. The nanopattern can be constructed at least for use in wide area applications. Wide area applications include applications using nanoimprint molds with relatively large surface areas, particularly when compared to the surface area of biospecimens. In one example, the nanoimprint molds can have dimensions on the order of about 1 foot×1 foot. One of skill in the art, with the benefit of the present disclosure, can appreciate that nanoimprint molds of larger dimensions or smaller dimensions are within the scope of the embodiments described herein. In some examples, the nanoimprint mold may take a form of a sheet that can be attached to a surface of a column. The column can then be fabricated into a roller type imprinting device. A roller type imprinting device can be used to mold to imprint a relatively large surface area compared to the dimensions of the nanoimprint mold itself.

An antireflective surface formed or constructed with an imprint nanomold, for example, may include regularly spaced nanopillars with a base and a top. The formation of nanopillars on a surface may be achieved using a molding surface of the nanoimprint mold. Before the nanoimprint mold can be used to form nanopillars on the surface, the molding surface of the nanoimprint mold is first formed or shaped. In some embodiments as described in more detail herein, the molding surface of the nanoimprint mold is formed from nanopillars that have been formed on a material such as silicon. These nanopillars guide the formation of the molding surface. Once completed, the molding surface can then mold or form nanopillars that are of a similar size and shape. Once the silicon (or other material) nanopillars are formed, hard substances such as metals, carbons, and/or the like are deposited on the silicon nanopillars to form the molding surface of the nanoimprint mold. Once the silicon nanopillars are removed, the resulting molding surface of the nanoimprint mold can be used to construct a surface that conforms to the shape of the molding surface.

In one example, the bases of the nanopillars used to create the molding surface are typically wider than the tops of the nanopillars. In one embodiment, the bases of the nanopillars may have a diameter of about 150 nanometers to about 200 nanometers. The top part of the nanopillars may have a diameter of about 50 nanometers to about 75 nanometers. In one embodiment, the bases of the nanopillars have a decreasing diameter moving towards the tops of the nanopillars while the nanopillar tops have a substantially unchanging diameter. The total height of the nanopillars can be from about 200 nanometers to about 400 nanometers. One of skill in the art, with the benefit of the present disclosure, can appreciate that other embodiments of the nanopillars used to form or create the molding surface of the nanoimprint mold may have dimensions within these ranges, but various embodiments contemplate dimensions or configurations that may be inside and/or outside of these ranges. Thus, the silicon (or other suitable material) nanopillars effectively form nanowells in the molding surface. The nanowells have a similar shape and size as the silicon nanopillars, which were removed from the molding surface, leaving nanowells in the molding surface.

When the nanoimprint mold is applied to a surface, usually by an application of some force, the surface of the material typically deforms to fill the nanowells. When the nanoimprint mold is removed, the material's surface retains the imprint of the molding surface and thus has the properties associated with the molding surface. This allows a nanoimprint mold that can endow a surface with properties such as, by way of example only and not limitation, antireflectivity, hydrophobicity, self-cleaning, and the like or any combination thereof. In some examples, the nanoimprint mold can endow a surface with cell adhesion properties. Cell adhesion properties can provide bio-compatibility, for example in implants and the like.

A nanoimprint mold generally includes a mold body that defines a molding surface. The mold body is formed by depositing layers of material in succession. For example, the mold body may include alternating layers of metal and carbon nanotubes. The molding surface is defined by depositing the mold body over a material such as silicon that has been shaped. The shape of the material is reflected in the molding surface. When the nanoimprint mold is used to mold a surface, the molding surface shapes the surface according to the shape of the material used to form the molding surface.

The formation of a nanoimprint mold begins with a thin substrate from a material such as silicon or another appropriate material. Using any of a variety of well-known lithography techniques, a thin substrate with nanoholes formed thereon is filled with a material such as silicon to form nanopillars. Photoresist, for example, may be used to form nanopillars in the nanoholes and/or to form the nanoholes themselves.

The photoresist is then removed and the nanopillars on the substrate are partially etched to have shaped ends. The ends may have, by way of example only, hemi-ellipsoidal shapes (or other appropriate shapes including spheroid). FIG. 1, for example, shows a side view of an illustrative embodiment of a substrate 100 with nanopillars 102 formed on a surface of the substrate 100. The nanopillars 102 may have been etched or partially etched to form, by way of example only, shaped ends 104. As previously described, the shaped ends 104 may be hemi-ellipsoidal, spheroid, or the like. After the nanopillars 102 are formed with the shaped ends 104, additional material is deposited on the nanopatterned surface.

Figure 2:
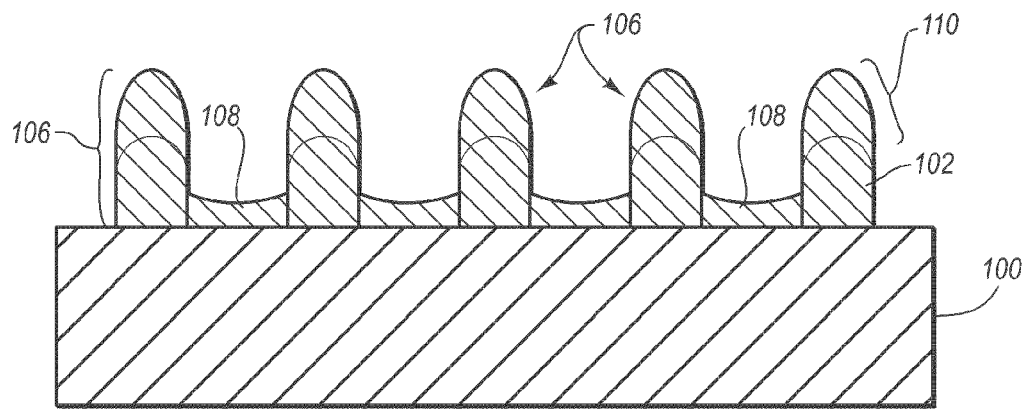
FIG. 2 shows a side view of an illustrative embodiment of the nanopillars of FIG. 1 after additional material has been deposited.

FIG. 2 shows a side view of an illustrative embodiment of the nanopillars 102 after additional material (e.g., silicon) is deposited. The deposition of the additional material on the nanopillars 102 form nanopillars 106 having tips 110. The nanopillars 106 are longer or have more height than the nanopillars 102. FIG. 2 also shows that the additional material is also deposited in valleys 108 between or among the nanopillars 106. The additional material may thus be deposited on the substrate 100 in addition to the nanopillars 102.

Figure 3:
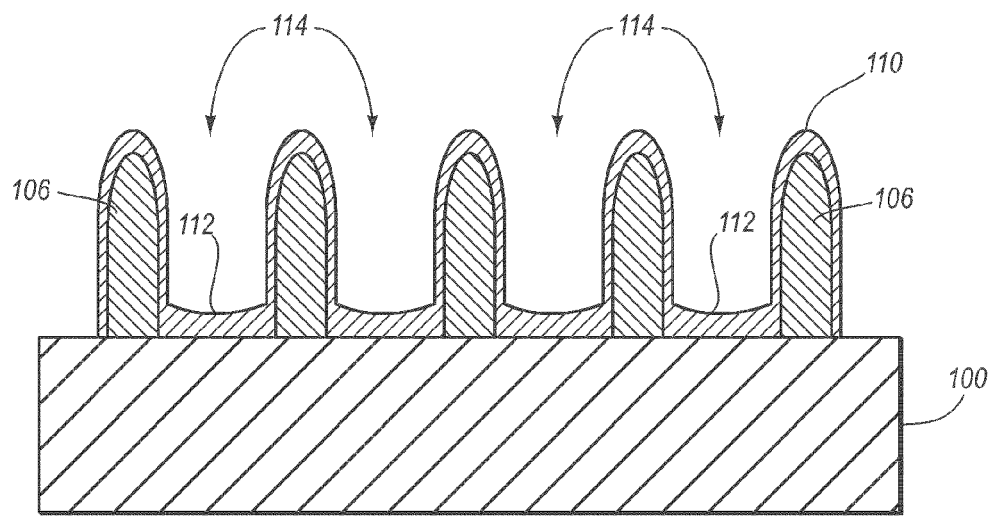
FIG. 3 shows a side view of an illustrative embodiment of the nanopillars of FIG. 2 after a first oxidization process.

After the additional material is deposited, the resulting nanostructure may be partially oxidized. FIG. 3 shows a side view of an illustrative embodiment of the nanopillars 106 after a first oxidation process. The tips 110 of the tops of the nanopillars 106 are oxidized. The nanopillars 106 are spaced or separated by spaces 114, and FIG. 3 further illustrates that root areas or valleys 112 between nanopillars 106 or the spaces 114 (which contain some of the deposited material described with reference to FIG. 2) are also oxidized. In some examples, any exposed material may be oxidized, including sides of the nanopillars 106.

Figure 4:
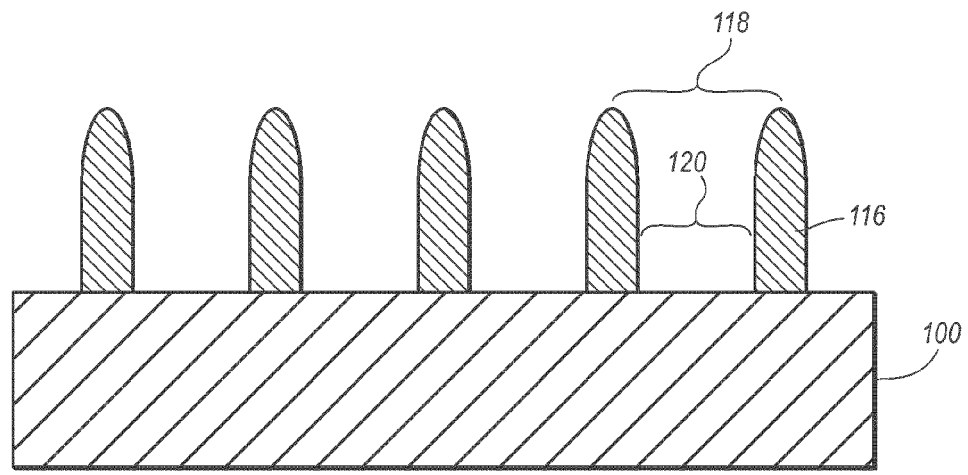
FIG. 4 shows a side view of an illustrative embodiment of the nanopillars of FIG. 3 after the oxidized material is removed.

FIG. 4 shows a side view of an illustrative embodiment of the nanopillars 106 after the oxidized material (e.g., $SiO_2$) is removed. For example, the oxidized material may be removed by etching. This results in nanopillars 116 on the substrate 100. In this example, a distance 120 between the bases of the nanopillars 116 is typically smaller than a distance 118 between the tops of the nanopillars 116. This reflects that the cross-section area or diameters of the nanopillars 116 decreases proceeding from the base of the nanopillar 116 to the top of the nanopillar 116.

As previously described, the diameter of the nanopillars 116 can change over the length or height of the nanopillars 116. In some embodiments, in some of the nanopillars 116, the diameter may remain somewhat constant, while the diameter may decrease in some of the nanopillars 116. For example, the diameter in the base or bottom portion of the nanopillar may decrease moving up the nanopillar while the diameter of the top portion of the nanopillar remains constant until the tip is reached, where the diameter again decreases. Alternatively, the diameter may be constant in the base or bottom portion of the nanopillar and then decrease in the top portion of the nanopillar. The diameters of the nanopillars 116 can be constant and/or vary from the bases of the nanopillars 116 to the tips of the nanopillars 116.

In alternative embodiments, the cross sectional shape of the nanopillars can be any appropriate shape, including circular, ellipsoidal, polygonal, and the like.

With reference back to FIGS. 3-5, after etching the oxidized material formed as illustrated in FIG. 3, the nanopillars 116 and the substrate 100 as illustrated in FIG. 4 are again partially oxidized.

Figure 5:
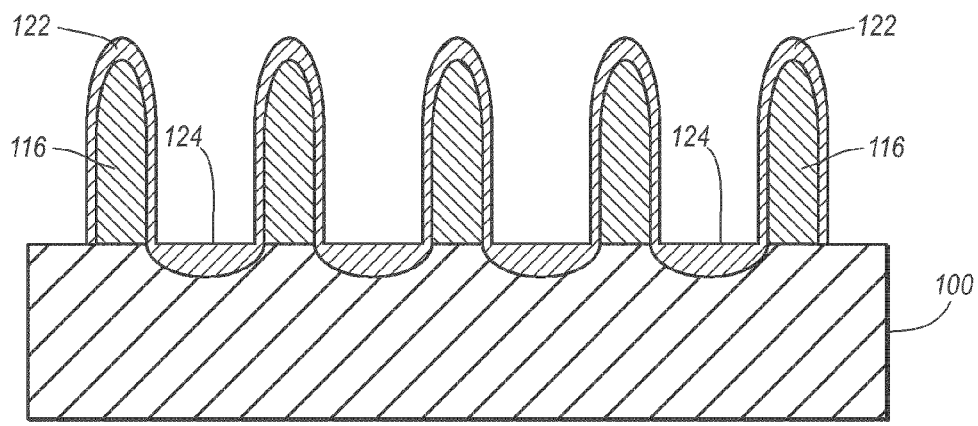
FIG. 5 shows a side view of an illustrative embodiment of the nanopillars of FIG. 4 after a second oxidization process.

FIG. 5 shows a side view of an illustrative embodiment of the nanopillars 116 after a second oxidization process. FIG. 5 illustrates oxidized material 122 formed at the tips of the nanopillars 116 and at the root 124 of the nanopillars 116. The sides of the nanopillars 116 may also be oxidized to some extent. In addition, some of the substrate 100 between the nanopillars 116 may also be oxidized. After this second oxidization, a relatively hard substance may be deposited.

Figure 6:
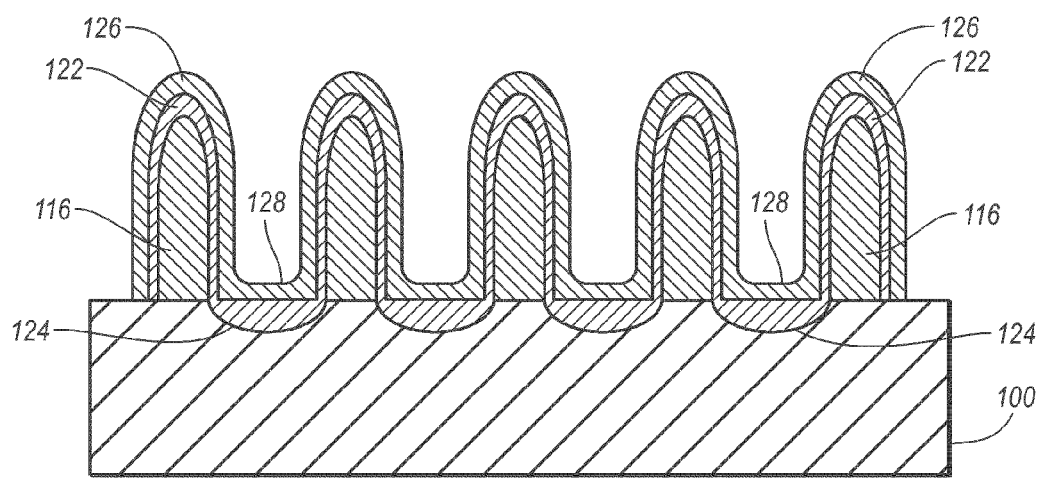
FIG. 6 shows a side view of an illustrative embodiment of the nanopillars of FIG. 5 after the deposition of a hard substance.

FIG. 6 shows a side view of an illustrative embodiment of the nanopillars 116 after the deposition of a hard substance 126. The hard substance 126 may be deposited on the oxidized material at the root 124 of or between the nanopillars 116 and the hard substance 126 may also be deposited on the oxidized material 122 at the tips of the nanopillars 116. The hard substance 126 may also be deposited on the sides of the nanopillars 116 as illustrated in FIG. 6. The hard substance 126 can be deposited using conventional metal deposition techniques and forms a layer 128 that has a shape that is similar to the nanopillars 116 formed on the substrate 100. The hard substance 126 deposited in FIG. 6 may be metal such as tungsten, iron, titanium, and the like.

Figure 7:
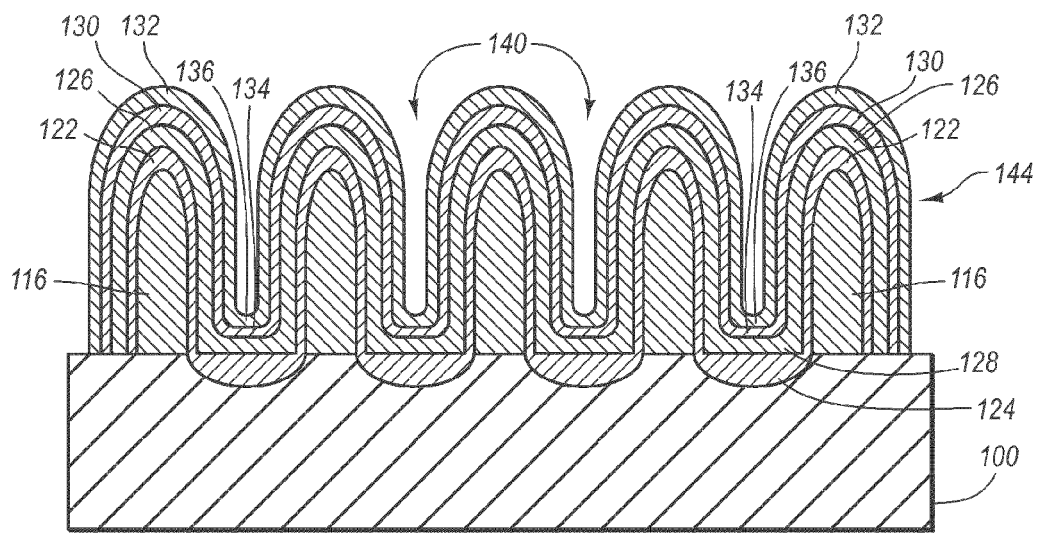
FIG. 7 shows a side view of an illustrative embodiment of the nanopillars of FIG. 6 after the deposition of carbon nanotubes on the hard substance.

FIG. 7 illustrates a side view of the nanoimprint mold after the deposition of carbon nanotubes on the hard substance. In one example, graphenes can also be deposited on the hard substance. FIG. 7 also illustrates the formation of a body 144 of the nanoimprint mold, which may be formed from multiple layers of suitable materials. When the hard substance 126 has sufficient thickness, for example, the layer 128 of the hard substance 126 may be sprayed with carbon nanotube or another material such as graphenes can be deposited on the hard substance 126. Thus, the body 144 of the nanoimprint mold may include a layer, such as the layer 128, of the hard substance 126 and a layer 134 of carbon nanotube 130. In some instances, the process of depositing alternating layers of a hard substance and carbon nanotube can be repeated at least twice to form the body 144 of the nanoimprint mold.

FIG. 7 illustrates the substrate 100 and the nanopillars 116 that are used to form the body 144 of the nanoimprint mold. After the oxidized material at the root 124 is formed, alternating layers of a hard substance and carbon nanotube are deposited. The nanoimprint mold may include, in this example, a first layer 128 of the hard substance 126, a layer 134 of carbon nanotube 130, and a layer 136 of a hard substance 132. These layers are continuous layers that essentially follow the shape of the nanopillars 116. As a result, a similar structure (e.g., alternating layers of a hard substance and carbon nanotube) is present at the tips and sides of the nanopillars 116, as illustrated by the layers 128, 134, and 136, respectively, of the hard substance 126, the carbon nanotube 130, and the hard substance 132. These layers can be followed by another layer of carbon nanotube or other fullerene or other material or hard substance. As additional layers are added, the space 140 between the nanopillars decreases or becomes filled with layers as described herein and becomes more solid. This layered structure imparts strength to the body 144 of the nanoimprint mold.

The layers illustrated in FIG. 7 can be formed from metals (e.g., tungsten, titanium, iron) and carbon nanotube or similar material. When multiple layers of metals or other hard substances are present, the metals or hard substances may be different. In some embodiments, a hard metal carbide suitable for high pressure imprinting can be obtained. In one example, the metal carbide is obtained by reaction with $CH_4$. The layers of hard substance and carbon nanotube or other fullurene form the body 144 of a nanoimprint mold as previously described.

Figure 8:
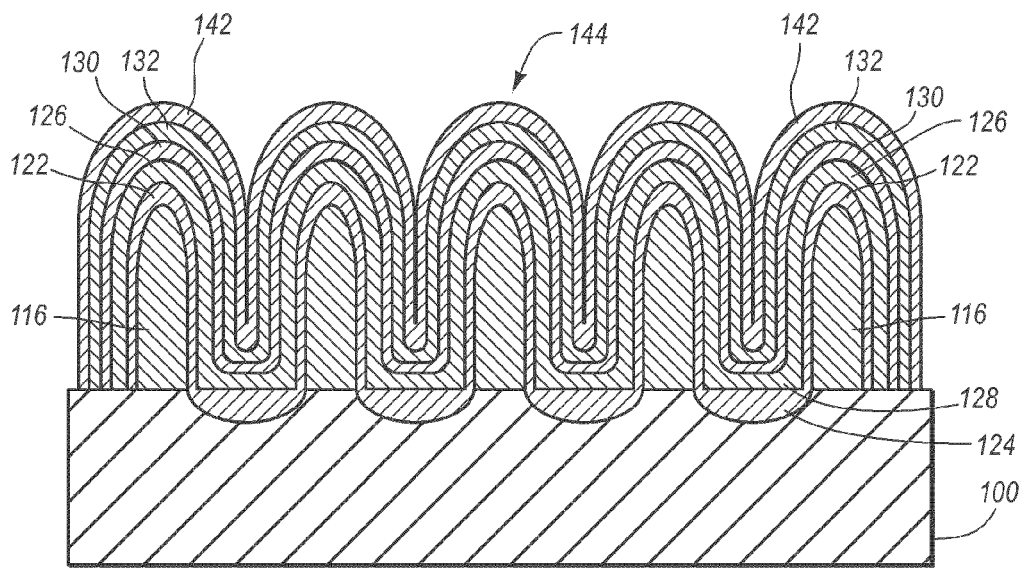
FIG. 8 illustrates an example of a nanoimprint mold that includes alternating layers of a hard substance and carbon nanotubes that form a body of the nanoimprint mold.

FIG. 8 illustrates a side view of a nanoimprint mold that includes alternating layers of the hard substance 126 and the carbon nanotube 130 or other material. FIG. 8 illustrates an example of the nanoimprint mold where the body 144 has been completed and includes alternating layers of a hard substance, such as the hard substance 126, and another material such as the carbon nanotube 130. More specifically, this embodiment includes a layer of the hard substance 126, a layer of the carbon nanotube 130, a layer of the hard substance 132, and a layer of the carbon nanotube 142. These layers have sufficient thickness to close or fill the space 140 and provide the body 144 that is substantially solid. The body 144 is resistant to fracture.

In other embodiments, the layers of the body 144 can include repeated atomic layer deposition (ALD) of aluminum, iron carbide, aluminum, iron carbide, etc. The layers may also be formed from aluminum, carbon nanotube, aluminum, iron carbide, etc. In another embodiment, the layers may be formed from metal carbide, graphenes, metal carbide, graphenes, etc. Embodiments also extend to combinations of different materials. Thus, more than one hard substance and more than one other material may be used. For example, a nanoimprint mold may include carbon nanotube in one layer while using graphenes in another layer.

More generally, the hard substance provides the hardness used for imprinting while the carbon nanotube, graphenes, or other materials provide the nanoimprint mold with flexibility. The layers in the body 144 typically each have a thickness between about 3 nanometers and 30 nanometers. One of skill in the art, with the benefit of the present disclosure can appreciate that the layers can have a thickness that is greater than 30 nanometers or less than 3 nanometers. Further, the layers in the body 144 can have different thicknesses.

Once the body 144 is formed, the material (e.g., the substrate 100 and the nanopillars 116) used to form or shape a molding surface 146 (see FIG. 9) of the nanoimprint mold is removed. The removal of the substrate 100 can be accomplished, for example, by grinding the substrate 100, oxidizing the remaining material (e.g., Silicon) and then etching the remaining oxidized substrate 100 and the oxidized nanopillars 116. In one example, the oxidized material formed as illustrated in FIG. 5 may also be removed at this time.

Figure 9:
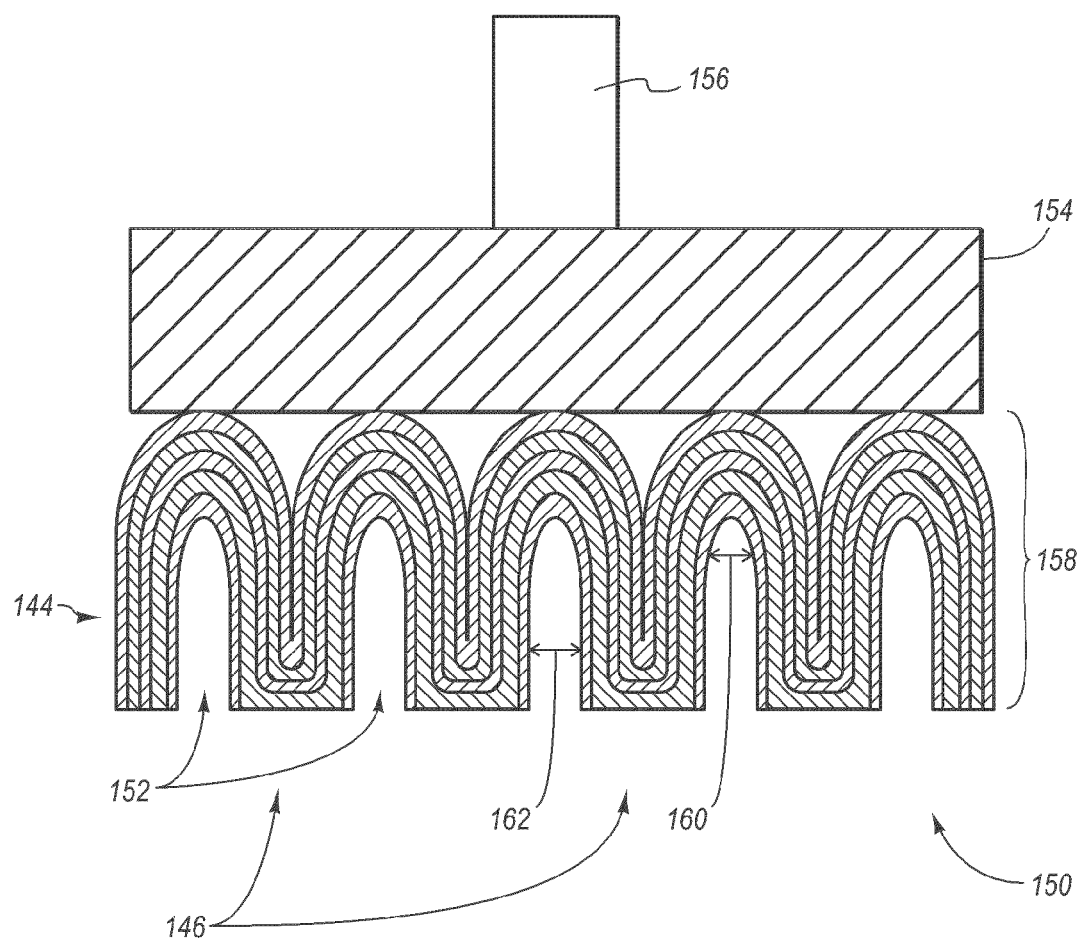
FIG. 9 illustrates an example of a nanoimprint mold after the substrate and nanopillars have been removed.

FIG. 9 illustrates an example of a nanoimprint mold after the substrate 100 and nanopillars 116 have been removed. As illustrated in FIG. 9, a nanoimprint mold 150 remains after the substrate 100 and the nanopillars 116 have been removed. A hard substrate 154 and a handle 156 may be attached to the mold 150 opposite the molding surface 146. In some embodiments, the surface of the body 158 opposite the molding surface 146 may also be smoothed or ground in order to provide an attachment surface that can bond or otherwise connect with the hard substrate 154.

The mold 150 thus includes a finished body 158 that includes valleys or nanowells 152 that correspond to and have the shape of the nanopillars 116. The nanowells 152 thus have at least a diameter 162 and a diameter 160 in one embodiment. The diameter 162 may be constant over a portion of the nanowells 152 while the diameter 160 may change over a portion of the nanowells 152. The diameters 160 and 162 may formed according to the diameters of the nanopillars 116 previously described.

The molding surface 146 can be used to imprint material such as, by way of example, polymer film, titania sol, and the like to produce or construct surfaces in the material being imprinted or molded that are antireflective, self-cleaning, hydrophobic, antifouling or that have other characteristics or properties. Imprinting a material using the nanoimprint mold 150 produces or shapes the material being imprinted according to the molding surface 146.

The nanoimprint mold, which may be hard and resistant to fracture, can create nanopillars on a surface of the material being imprinted or molded that approximate the nanopillars 116 used to manufacture the nanoimprint mold and form the molding surface. Thus, the dimensions of the nanowells 152 are similar to the dimensions of the nanopillars 116 as previously described.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

Figure 10:
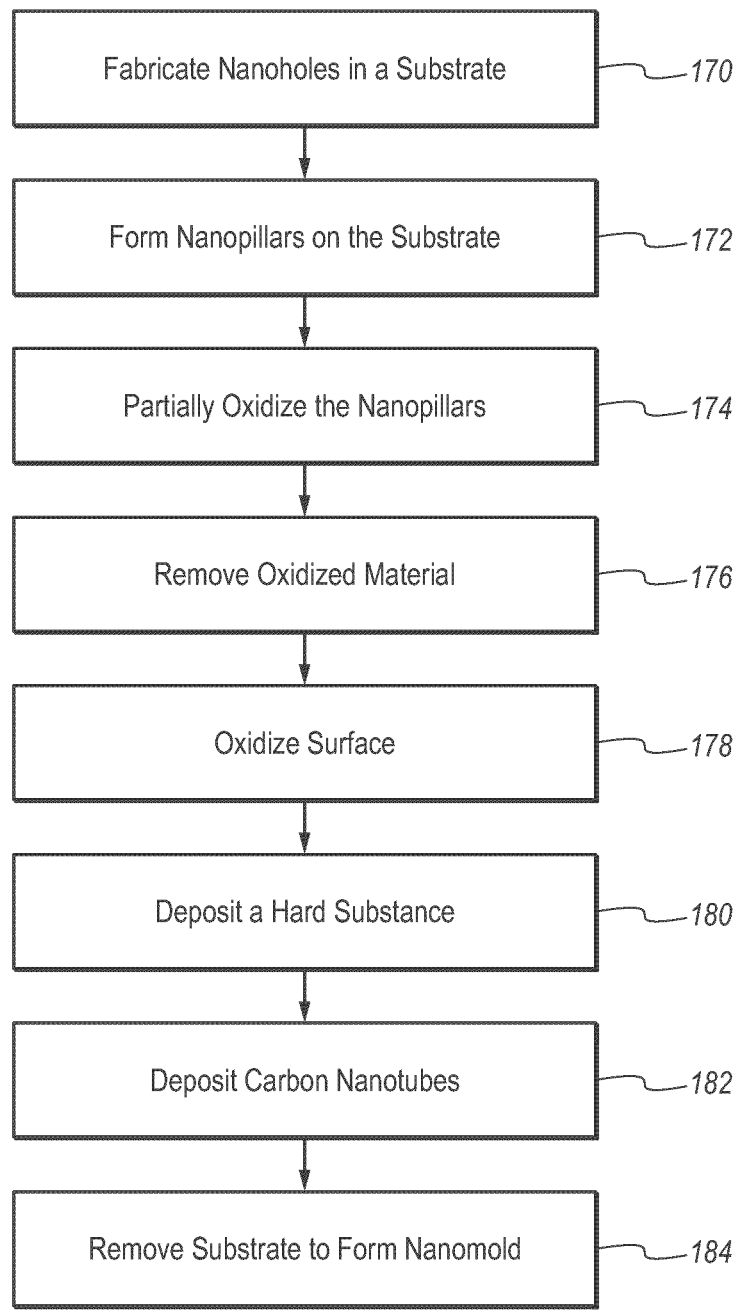
FIG. 10 shows a flow diagram of an illustrative embodiment of a method for forming a nanoimprint mold that can form a surface structure in a material that is molded according to a molding surface of the nanoimprint mold.

FIG. 10 shows a flow diagram of an illustrative embodiment of a method for forming a nanoimprint mold that can form a surface structure in a material that is molded according to a molding surface of the nanoimprint mold. Beginning in block 170, nanoholes are fabricated in a substrate. The nanoholes can be arranged in a geometric pattern, such as hexagonally arrayed, and may have a cylindrical shape. The nanoholes fabricated in the substrate may have a depth of the half length of the nanopillar. The nanoholes can be arranged in other patterns, including symmetrical patterns, asymmetrical patterns, and the like or any combination thereof.

In block 172, nanopillars are then formed on the substrate. In one example, the operation of block 170 is optional and the nanopillars can be formed without having first formed nanoholes in the substrate. Forming the nanopillars can also include partially etching the nanopillars to form a top that has a hemi-ellipsoidal shape or other shape. Forming the nanopillars may also include the deposition of additional material on the substrate and on the existing nanopillars. This increases the length (or height) of the nanopillars on the substrate, and also deposits material between the nanopillars on the substrate.

In block 174, the nanopillars are partially oxidized, which includes oxidizing the material on the substrate between the nanopillars. In block 176, the oxidized material is removed. In block 178, the surface, including the nanopillars, is again oxidized.

After the second oxidation, in block 180, a hard substance may be deposited to a predetermined thickness. In block 182, a second layer of material (e.g., carbon nanotube, graphenes, or other suitable material) is deposited or sprayed on the hard substance. This second layer of material may provide flexibility to the nanomold. The deposition of a hard substance and the second material can be repeated as desired. In some embodiments, a particular layer may include a plurality of layers. For example, the second layer of material may include multiple layers of graphene. Alternatively, the layers in the nanomold may include a different number of hard substance layers compared to layers of carbon nanotube. Alternatively, the body of the nanoimprint mold may include a single layer of a hard substance. Embodiments described herein may also include materials that have high tensile strength or stiffness. Combining a metal layer such as iron with carbon nanotubes provides a body that is stiff, which is advantageous for wide area applications and well as resistant to fracture. As previously stated, the hard substance (e.g., metal carbide) provides the hardness for imprinting while the second material (e.g., carbon based material) provides flexibility to the nanoimprint mold.

Once these layers are deposited to form the body of the nanoimprint mold, in block 184, the substrate and nanopillars are removed from the nanoimprint mold. This may include grinding the substrate, oxidizing the remaining material and then etching the oxidized material.

Optionally, a thin layer of gold (Au), or other material such as a layer of F-containing polymer or a self assembled monolayer can be deposited on the molding surface. This may provide, by way of example only, the mold with a non-sticking molding surface.

As a result, a wide area application of imprinting can be achieved. In addition, the mold can be repeatedly used to mold or form a surface with the molding surface of the mold. This results in a surface that may be antireflecting, hydrophobic, and the like, depending on the configuration of the nanoimprint mold and its molding surface.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds, compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into sub-ranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A nanoimprint mold comprising:
   a mold body having a molding surface, the mold body comprising:
   a plurality of nanowells, the nanowells defined by multiple layers including at least one layer of a hard substance and at least one layer of a second material that is more flexible than the hard substance and that provides flexibility to the mold body,
   wherein the molding surface includes at least one layer of the hard substance, and
   wherein the at least one layer of the hard substance alternates with the at least one layer of the second material in the mold body, and
   wherein the second material is selected from carbon nanotubes, graphenes, fullerenes, or combinations thereof.

2. The nanoimprint mold of claim 1, wherein the plurality of nanowells have a cross-sectional shape that is circular, ellipsoidal, polygonal, or combination thereof.

3. The nanoimprint mold of claim 1, wherein the molding surface is adapted to generate a hydrophobic surface in a material being molded.

4. The nanoimprint mold of claim 1, wherein the molding surface is adapted to generate an antifouling surface in a material being molded.

5. The nanoimprint mold of claim 1, wherein the molding surface is adapted to generate an antireflective surface in a material being molded.

6. The nanoimprint mold of claim 1, wherein each of the multiple layers has a thickness between about 3 nanometers and 30 nanometers.

7. The nanoimprint mold of claim 1, wherein:
   the hard substance is selected from metals, aluminum, tungsten, titanium, iron, metal carbides, iron carbides, or combination thereof.

8. The nanoimprint mold of claim 1, wherein a moldable material is located in the plurality of nanowells when the moldable material is molded.

9. The nanoimprint mold of claim 1, wherein the multiple layers alternate between a hard substance and second material.

10. A nanoimprint mold comprising: a mold body having a plurality of layers, the mold body having a molding surface, wherein the molding surface of the mold body is shaped according to a shape of removable substrate, wherein the shape of the removable substrate defines nanowells in the molding surface, wherein the plurality of layers are deposited between the nanowells such that a sidewall of the layers defining a first nanowell contact a sidewall of the layers defining a second nanowell.

11. The nanoimprint mold of claim 10, wherein the substrate is shaped to include nanopillars, wherein the nanopillars form the nanowells in the molding surface of the mold body.

12. The nanoimprint mold of claim 10, wherein the plurality of layers includes alternating layers of a first material and a second material.

13. The nanoimprint mold of claim 10, wherein the first material is harder than the second material.

14. The nanoimprint mold of claim 10, wherein:
   the first material is selected from metals, aluminum, tungsten, titanium, iron, metal carbides, iron carbides, or combination thereof; and/or
   the second material is selected from carbon nanotubes, graphenes, fullerenes, or combinations thereof.

15. The nanoimprint mold of claim 10, wherein the molding surface is formed of the first material.

16. The nanoimprint mold of claim 15, wherein a layer of gold, F-containing polymer, or a self-assembled monolayer is deposited on the molding surface to provide a non-sticking molding surface.

17. The nanoimprint mold of claim 10, wherein at least one of the plurality of layers is oxidized.

18. The nanoimprint mold of claim 10, wherein the mold body is formed on a removable substrate having a shape, and wherein the molding surface is configured by the shape of the removable substrate to generate a hydrophobic surface in a material being molded, an antifouling surface in a material being molded, or an anti reflective surface in a material being molded.

19. A nanoimprint mold comprising: a mold body formed on a surface of a removable substrate, the mold body having a molding surface that is formed according to a shape of the surface of the removable substrate, the mold body comprising: a plurality of layers including at least one layer of a first material that provides stiffness to the mold body and at least one layer of a second material that is more flexible than the first material and that provides flexibility to the mold body, wherein: the molding surface includes the first material, the shape of the surface of the removable substrate forms nanowells in the molding surface, and the plurality of layers are formed with a thickness such that a sidewall of the layers defining a first nanowell contact a sidewall of the layers defining a second nanowell.

20. The nanoimprint mold of claim 19, wherein the first material is harder than the second material.

21. The nanoimprint mold of claim 20, wherein:
the first material is selected from metals, aluminum, tungsten, titanium, iron, metal carbides, iron carbides, or combination thereof; and/or
the second material is selected from carbon nanotubes, graphenes, fullerenes, or combinations thereof.

22. The nanoimprint mold of claim 19, wherein the shape of the surface of the removable substrate includes nanopillars and the molding surface includes nanowells corresponding to the nanopillars.

23. The nanoimprint mold of claim 19, wherein the molding surface is configured to generate a hydrophobic surface in a material being molded, an antifouling surface in a material being molded, or an antireflective surface in a material being molded.

* * * * *

UNITED STATES PATENT AND TRADEMARK OFFICE
CERTIFICATE OF CORRECTION

| | | |
|---|---|---|
| PATENT NO. | : 8,608,468 B2 | Page 1 of 1 |
| APPLICATION NO. | : 13/407488 | |
| DATED | : December 17, 2013 | |
| INVENTOR(S) | : Lee | |

It is certified that error appears in the above-identified patent and that said Letters Patent is hereby corrected as shown below:

In the Specification

In Column 5, Line 48, delete "fullurene" and insert -- fullerene --, therefor.

In the Claims

In Column 10, Line 55, in Claim 18, delete "anti reflective" and insert -- antireflective --, therefor.

Signed and Sealed this
Eighth Day of April, 2014

Michelle K. Lee
*Deputy Director of the United States Patent and Trademark Office*